US009124250B2

(12) United States Patent
Hinrichs (10) Patent No.: US 9,124,250 B2
(45) Date of Patent: Sep. 1, 2015

(54) CLOCK DOUBLER INCLUDING DUTY CYCLE CORRECTION

(71) Applicant: QUALCOMM Incorporated, San Diego, CA (US)

(72) Inventor: Jeffrey Mark Hinrichs, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/954,691

(22) Filed: Jul. 30, 2013

(65) Prior Publication Data

US 2015/0035570 A1 Feb. 5, 2015

(51) Int. Cl.
| H03K 5/00 | (2006.01) |
| H03K 5/156 | (2006.01) |
| H02M 3/07 | (2006.01) |
| H03K 3/017 | (2006.01) |
| H03L 7/089 | (2006.01) |

(52) U.S. Cl.
CPC ............. *H03K 5/00006* (2013.01); *H02M 3/07* (2013.01); *H03K 3/017* (2013.01); *H03K 5/1565* (2013.01); *H03L 7/089* (2013.01)

(58) Field of Classification Search
CPC ......... H03K 7/08; H03K 7/10; H03K 5/1565; H03K 4/502; H03K 5/151; H03L 7/0812; H03L 7/07; H03L 5/131; H03L 5/133
USPC .................. 327/172, 173, 174, 175
See application file for complete search history.

(56) References Cited

U.S. PATENT DOCUMENTS

| 8,049,540 B2 | 11/2011 | Shanan |
| 8,149,031 B1 | 4/2012 | Aslanzadeh |
| 8,198,927 B2 | 6/2012 | Moore |
| 2002/0075050 A1 | 6/2002 | Ma |
| 2011/0291726 A1* | 12/2011 | Kim et al. ................... 327/175 |
| 2012/0200328 A1 | 8/2012 | Yao |

OTHER PUBLICATIONS

International Search Report and Written Opinion—PCT/US2014/047959—ISA/EPO—Nov. 12, 2014.
Hou N., et al., "Design of high performance CMOS charge pump for phase-locked loops synthesizer", Communications, 2009. APCC 2009. 15th Asia-Pacific Conference on, IEEE, Piscataway, NJ, USA, Oct. 8, 2009, pp. 209-212, XP031597489, ISBN: 978-1-4244-4784-8.

(Continued)

*Primary Examiner* — John Poos
(74) *Attorney, Agent, or Firm* — Arent Fox LLP (57) ABSTRACT

Exemplary embodiments are related to a clock doubler. A device may include a duty cycle correction circuit configured to receive an input clock signal and convey a corrected clock signal. The duty cycle correction circuit may include a first circuit to convey an output voltage during a first cycle of the input clock signal and correct a current mismatch of the first circuit during a second cycle of the input clock signal. The duty cycle correction circuit may also include a second circuit to convey the output voltage during the second cycle and correct a current mismatch of the second circuit during the first cycle. Further, the device may include a clock generator for receiving the corrected clock signal and generating an output clock.

19 Claims, 9 Drawing Sheets

(56) References Cited

OTHER PUBLICATIONS

Huh H., et al., "Comparison Frequency Doubling and Charge Pump Matching Techniques for Dual-Band<tex>$DeltaSigma$</tex>Fractional-<tex>$N$</tex>Frequency Synthesizer", IEEE Journal of Solid-State Circuits, IEEE Service Center, Piscataway, NJ, USA, vol. 40, No. 11, Nov. 1, 2005, pp. 2228-2236, XP011141631, ISSN: 0018-9200, DOI:10.1109/JSSC.2005.857368.

Xu H., et al., "Design of a low power charge pump circuit for phase-locked loops", High Speed Intelligent Communication Forum (HSIC), 2012 4th International, IEEE, May 10, 2012, pp. 1-4, XP032203041, DOI: 10.1109/HSIC.2012.6213018, ISBN: 978-1-4673-0678-2.

* cited by examiner

CLOCK DOUBLER INCLUDING DUTY CYCLE CORRECTION

BACKGROUND

1. Field

The present invention relates generally to a clock doubler including duty cycle correction. More specifically, the present invention relates to embodiments for generating a clock signal based on a corrected duty cycle.

2. Background

Clock signals, which may be generated with various types of oscillator and supporting circuitry, are commonly used in many electronics circuits and for various purposes. For example, clock signals may be used to trigger synchronous circuits (e.g., flip-flops) in digital circuits such as processors, memory devices, and so on.

A clock signal, which has a duty cycle that is determined by the time duration at logic high and the time duration at logic low, continually transitions between logic high and logic low. It may be desirable to generate a clock signal having a duty cycle that is as close to 50% as possible, so that the logic high time duration is close to the logic low time duration. A digital circuit may use both the rising and falling edges of the clock signal to trigger synchronous circuits to achieve faster operating speed. A 50% duty cycle for the clock signal may then provide the synchronous circuits with maximum timing margins.

A duty cycle of a clock signal may be distorted due to various phenomena such as mismatches in transistor devices used to generate the clock signal. Great care is often used in designing clock generation and distribution circuits to minimize device mismatches. Digital circuits fabricated with advanced IC processes typically operate at high speed, e.g., one giga-Hertz (GHz) or higher. The high speed corresponds to a smaller clock period, e.g., 1 nanosecond (nsec) for 1 GHz. Small circuit mismatches may then translate to a relatively large error in duty cycle with the smaller clock period.

The clock duty cycle problem is often addressed by running an oscillator at twice the desired frequency and dividing an oscillator output signal by two to generate a clock signal with a good duty cycle. However, this approach may be undesirable or inadequate for several reasons. First, more power is consumed to operate the oscillator and the divide-by-2 circuit at twice the desired frequency. Second, significant duty cycle distortion may still be present in the clock signal due to random device mismatches in the divide-by-2 circuit.

A need exists for a clock doubler. More specifically, a need exists for embodiments related to a clock doubler for generating a clock signal based on a corrected a duty cycle.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As will be appreciated by a person having ordinary skill in the art, often, only one crystal oscillator reference clock (e.g., 19.2 MHz) is available to a phase-locked loop (PLL) based frequency synthesizer. For PLL's using ring-oscillator voltage controlled oscillators (VCOs), an output phase noise can be greatly improved by increasing the a bandwidth of the PLL. When the PLL is already designed for its maximum stable bandwidth for a given reference frequency, the bandwidth may be further increased only by increasing the reference frequency.

Figure 1:
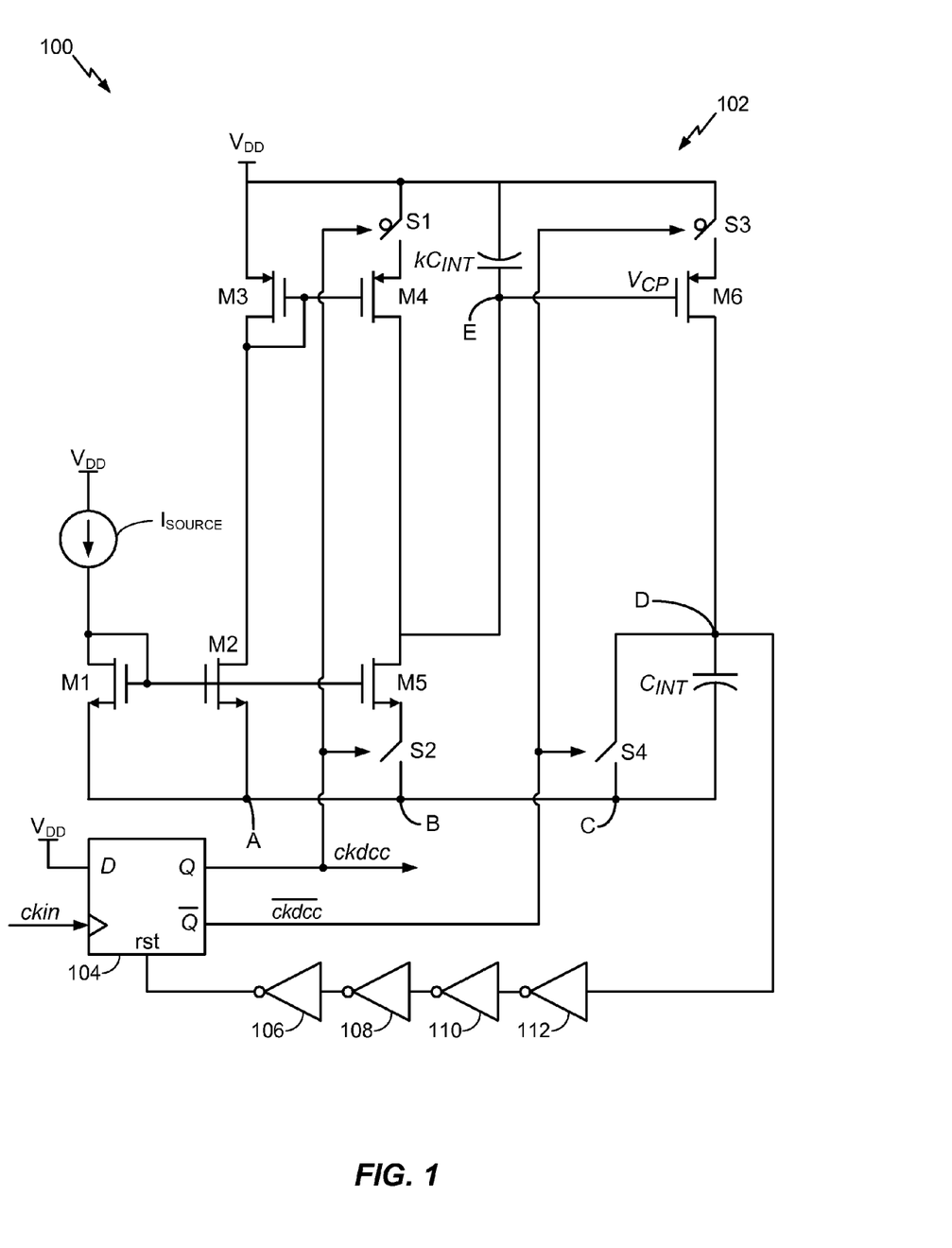
FIG. 1 illustrates a duty cycle corrector.

FIG. 1 depicts a duty cycle corrector 100. Duty cycle corrector 100 includes a charge pump 102, a flip-flop 104, and logic devices 106, 108, 110, and 112. As illustrated, each of logic devices 106, 108, 110, and 112 may comprise an inverter. Flip-flop 104 is configured to receive an input clock signal ckin having a duty-cycle that is not 50%. Further, flip-flop 104 is configured to receive a supply voltage $V_{DD}$ via a port D and a feedback signal via a reset port rst. Flip-flop 104 is further configured to output a clock output ckdcc via port Q and a clock output $\overline{\text{ckdcc}}$ via port $\overline{Q}$.

Charge pump 102 includes a current source $I_{SOURCE}$, transistors M1-M6, capacitors $kC_{INT}$ and $C_{INT}$, and switches S1-S4. Current source $I_{SOURCE}$ is coupled between supply voltage $V_{DD}$ and a drain of transistor M1, which is further coupled to a gate of transistor M1, a gate of transistor M2, and a gate of transistor M5. A source of transistor M1 is coupled to a node A, which is further coupled to a node B and a source of transistor M2. A drain of transistor M2 is coupled to a drain of transistor M3, which is further coupled to a gate of transistor M3 and a gate of transistor M4. A source of transistor M3 is coupled to supply voltage $V_{DD}$, and a source of transistor M4 is switchably (e.g., selectively) coupled to supply voltage $V_{DD}$ via switch S1. A drain of transistor M4 is coupled to a drain of transistor M5, and a source of transistor M5 is switchably coupled to node B via switch S2.

Capacitor $kC_{INT}$ is coupled between supply voltage $V_{DD}$ and a node E, which is coupled to the drain of transistor M5 and a gate of transistor M6. Capacitor $C_{INT}$ is coupled between a node C and a drain of transistor M6 via a node D. Transistor M6 is switchably coupled to supply voltage $V_{DD}$ via switch S3, and nodes C and D may be coupled together via switch S4. Node D is coupled to an input of logic device 112. Further, switches S1 and S2 are configured to receive a signal conveyed from port Q of flip-flop 104 and switches S3 and S4 are configured to receive a signal conveyed from port $\overline{Q}$ of flip-flop 104.

A charge pump with nominally equal up and down currents and an integration capacitor is used to detect any mismatch between the high and low time of the input clock. A voltage on capacitor $kC_{INT}$ (i.e., voltage $V_{CP}$) controls a current conveyed to capacitor $C_{INT}$ via transistor M6. The amount of time it takes for the voltage on capacitor $C_{INT}$ to reach an inverter threshold is used to set the high time of the corrected clock. Ideally, when voltage $V_{CP}$ reaches a steady state, the corrected clock duty cycle must be 50%. One drawback of this approach is that it relies on exact matching of the charge pump up and down currents.

Exemplary embodiments, as described herein, are directed to a clock doubler including duty cycle mismatch cancellation. According to one exemplary embodiment, a device may include a duty cycle correction circuit configured to receive an input clock signal and convey a corrected output clock signal. The duty cycle correction circuit may include a first circuit to convey an output voltage during a first cycle of the input clock signal and correct a current mismatch of the first circuit during a second cycle of the input clock signal. The duty cycle correction circuit may also include a second circuit to convey the output voltage during the second cycle and correct a current mismatch of the second circuit during the first cycle. Further, the device may include a clock generator for receiving the corrected clock signal and generating an output clock signal.

According to another exemplary embodiment, the present invention includes methods for generating a clock signal. Various embodiments of such a method may include generating a corrected clock signal with a plurality of charge pumps, wherein each charge pump of the plurality is configured to correct current mismatch during a portion a cycle of an input clock signal. The method may also include generating an output clock having a frequency greater than a frequency of the corrected clock signal.

Other aspects, as well as features and advantages of various aspects, of the present invention will become apparent to those of skill in the art though consideration of the ensuing description, the accompanying drawings and the appended claims.

Figure 2A:
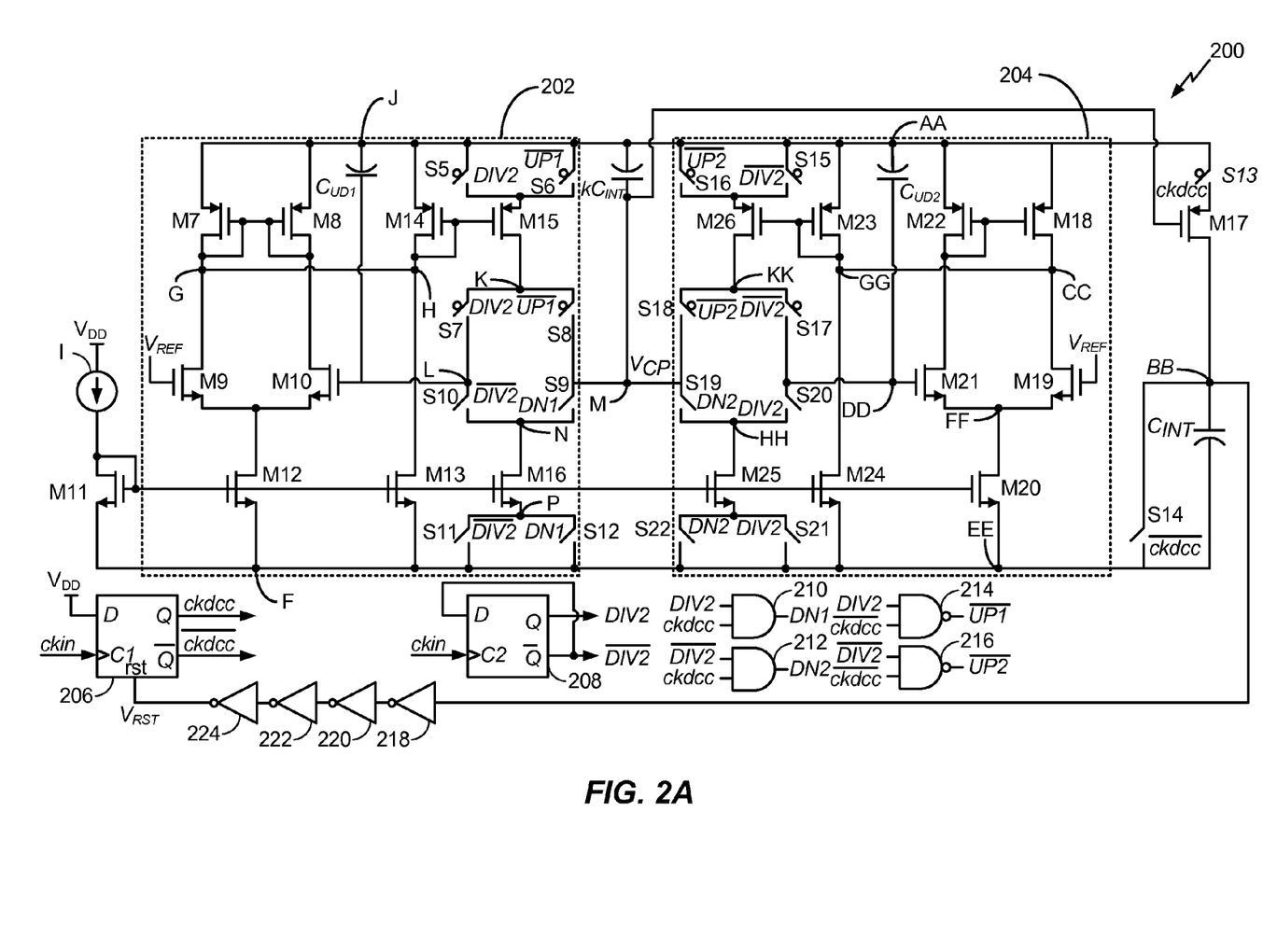
FIG. 2A depicts a duty cycle corrector, according to an exemplary embodiment of the present invention.

FIG. 2A depicts a device 200, according to an exemplary embodiment of the present invention. Device 200, which may comprise a duty cycle corrector, includes dual charge pumps. More specifically, device 200 includes a charge pump 202 and a charge pump 204. Device 200 further includes flip-flop 206, flip-flop 208, AND gates 210 and 212, NAND gates 214 and 216, and inverters 218, 220, 222, and 224. In addition, a current source I is configured for providing a bias current for device 200.

Charge pump 202 includes transistors M7-M16, switches S5-S12, and capacitor $C_{UD1}$. Current source I is coupled between supply voltage $V_{DD}$ and a drain of transistor M11, which is further coupled to a gate of transistor M11, a gate of transistor M12, a gate of transistor M13, and gate of transistor M16. A source of transistor M11 is coupled to a node F, which is further coupled to a source of transistor M12 and a source of transistor M13. A drain of transistor M12 is coupled to a source of transistor M9 and a source of transistor M10. A gate of transistor M9 is configured to receive a reference voltage $V_{REF}$, and a drain of transistor M9 is coupled to a node G, which is further coupled to a drain of transistor M7. A source of transistor M7 is coupled to a source of transistor M8, and a gate of transistor M7 is coupled to a gate of transistor M8. A gate of transistor M8 is coupled to a drain of transistor M8, which is further coupled to a drain of transistor M10.

A drain of transistor M13 is coupled to a drain of transistor M14 via a node H. As illustrated, node H is coupled to node G. A drain of transistor M14 is further coupled to a gate of transistor M14, which is also coupled to a gate of transistor M15. A source of transistor M14 is coupled to node J. A source of transistor M15 is switchably (e.g., selectively) coupled to supply voltage node J via switch S5, switch S6, or both. A drain of transistor M15 is coupled to a node K, which is switchably coupled to a node L via switch S7. Node K may also be coupled to a node M of device 200 via switch S8. Node L may be coupled to a node N via switch S10, and node M may be coupled to node N via switch S9. Node N is further coupled to a drain of transistor M16, and a source of transistor M16 is coupled to a node P, which is selectively coupled to node F via switch S11, switch S12, or both. In addition, capacitor $C_{UD1}$ is coupled between node J and a gate of transistor M10, which is also coupled to node L.

Charge pump 204 includes transistors M17-M26, switches S13-S22, and capacitors $C_{UD2}$ and $C_{INT}$. A source of transistor M17 is switchably (e.g., selectively) coupled to a node AA via switch S13, a gate of transistor M17 is coupled to node M of device 200, and a drain of transistor M17 is coupled to a node BB.

Transistor M20 has a source coupled to a node EE and a gate coupled to a gate of transistor M24, which is further coupled to the gates of transistors M25, M11, M12, M13, and M16. A drain of transistor M20 is coupled to a node FF, which is also coupled to a source of transistor M21 and a source of transistor M19. A gate of transistor M19 is configured to receive reference voltage $V_{REF}$, and a drain of transistor M19 is coupled to a drain of transistor M18 and a node CC, which is further coupled to a drain of transistor M23. A gate of transistor M21 is coupled to a node DD, and a drain of transistor M21 is coupled to a drain of transistor M22, which is further coupled to a gate of transistor M22 and a gate of transistor M18. A source of transistor M22 and a source of transistor M18 are each coupled to node AA.

In addition, a source of transistor M24 is coupled to node EE, and a source of transistor M25 may be coupled to node EE via switch S22, switch S21, or both. A drain of transistor M24 is coupled to a drain of transistor M23, which is further coupled to a gate of transistor M23 and node GG. A gate of transistor M23 is also coupled to a gate of transistor M26, and a source of transistor M23 is coupled to node AA. Furthermore, a drain of transistor M25 is coupled to a node HH, which may be coupled to node DD via switch S20 and node M via switch S19. Moreover, a drain of transistor M26 is coupled to a node KK, which may be coupled to node DD via switch S17 and node M via switch S18. Additionally, a source of transistor M26 may be coupled to node AA via switch S15, switch S16, or both.

It is noted that nodes J and AA are coupled together and capacitor $kC_{INT}$ of device 200 is coupled between node MM and node M. It is further noted that a charge pump voltage $V_{CP}$ may be conveyed via node M.

Moreover, flip-flop 206 includes a input port D coupled to supply voltage $V_{DD}$, a reset port rst coupled to an output of logic device 224 and configured to receive a reset voltage $V_{RST}$, and another port C1 configured to receive input clock ckin. Flip-flop 206 further includes an output port Q configured for conveying a signal ckdcc, which may be used to control operation of switch S13. Signal ckdcc may also be conveyed to AND devices 210 and 212, as described more fully below. Flip-flop 206 also includes another output port $\overline{Q}$ configured for conveying a signal $\overline{ckdcc}$, which may be used for controlling operation of switch S14. Signal $\overline{ckdcc}$ may also be conveyed to NAND devices 214 and 216, as described more fully below.

Flip-flop 208 includes a port C2 configured to receive input clock ckin. Flip-flop 206 further includes an output port Q configured for conveying a signal DIV2, which may be used to control operation of switches S5, S7, S20, and S21. Signal DIV2 may also be conveyed to AND device 210 and NAND device 214, as described more fully below. Flip-flop 206 also includes another output port $\overline{Q}$ configured for conveying a signal $\overline{DIV2}$, which may be used for controlling operation of switches S10, S11, S15, and S17. Signal $\overline{DIV2}$ may also be conveyed to AND device 212 and NAND device 216, as described more fully below. In addition, as illustrated in FIG. 2A, output port $\overline{Q}$ is coupled to an input port D of flip-flop 208.

AND gate 210 is configured to receive signal DIV2 and signal ckdcc and output signal DN1, which may be used for controlling switch S9. AND gate 212 is configured to receive signal $\overline{DIV2}$ and signal ckdcc and output signal DN2, which may be used for controlling switches S19 and S22. Further, NAND gate 214 is configured to receive signal DIV2 and signal $\overline{ckdcc}$ and output signal $\overline{UP1}$, which may be used for controlling switches S6 and S8. In addition, NAND gate 216 is configured to receive signal $\overline{DIV2}$ and signal $\overline{ckdcc}$ and output signal $\overline{UP2}$, which may be used for controlling switches S16 and S18.

Accordingly, device 200 includes two charge pumps (i.e., charge pumps 202 and 204), each with its own up/down mismatch correction circuit. Charge pumps 202 and 204 are configured to operate on alternate cycles of an input clock. More specifically, during a first cycle (i.e. phase), charge pump 202 may drive voltage $V_{CP}$, and charge pump 204 may detect and correct its mismatch. Further, during another phase (i.e., cycle), charge pump 204 may drive voltage $V_{CP}$ and charge pump 202 may detect and correct its mismatch.

As a more specific example, during one cycle (e.g., an even cycle), the input clock controls a duration of up and down currents of charge pump 202 that get integrated onto capacitor $kC_{INT}$. Simultaneously, the up/down current mismatch of charge pump 204 is integrated onto capacitor $C_{UD2}$. If the up and down currents of charge pump 204 are not equal, a GM stage (i.e., differential pair including transistors M21 and M19) measures a difference between reference voltage $V_{REF}$ (which, for example, may be nominally equal to a settled value of voltage $V_{CP}$) and a voltage on capacitor $C_{UD2}$ and adjusts the up current of charge pump 204 until it matches the down current of charge pump 204. More specifically, a correction current (i.e., a current flowing between the drain of transistor M23 and the drain of transistor M18) may be used to force the up current of charge pump 204 and the down current of charge pump 204 to be substantially equal.

Similarly, during another, different cycle (e.g., an odd cycle), the input clock controls a duration of up and down currents of charge pump 204 that get integrated onto capacitor $kC_{INT}$. Simultaneously, the up/down current mismatch of charge pump 202 is integrated onto capacitor $C_{UD1}$. If the up and down currents of charge pump 202 are not equal, a GM stage (i.e., including differential pair including transistors M9 and M10) measures a difference between reference voltage $V_{REF}$ (which, for example, is nominally equal to a settled value of voltage $V_{CP}$) and a voltage on capacitor $C_{UD1}$ and adjusts the up current of charge pump 202 until it matches the down current of charge pump 202. More specifically, a correction current (i.e., a current flowing between the drain of transistor M7 and the drain of transistor M14) may be used to force the up current of charge pump 202 and the down current of charge pump 202 to be substantially equal.

Figure 2B:
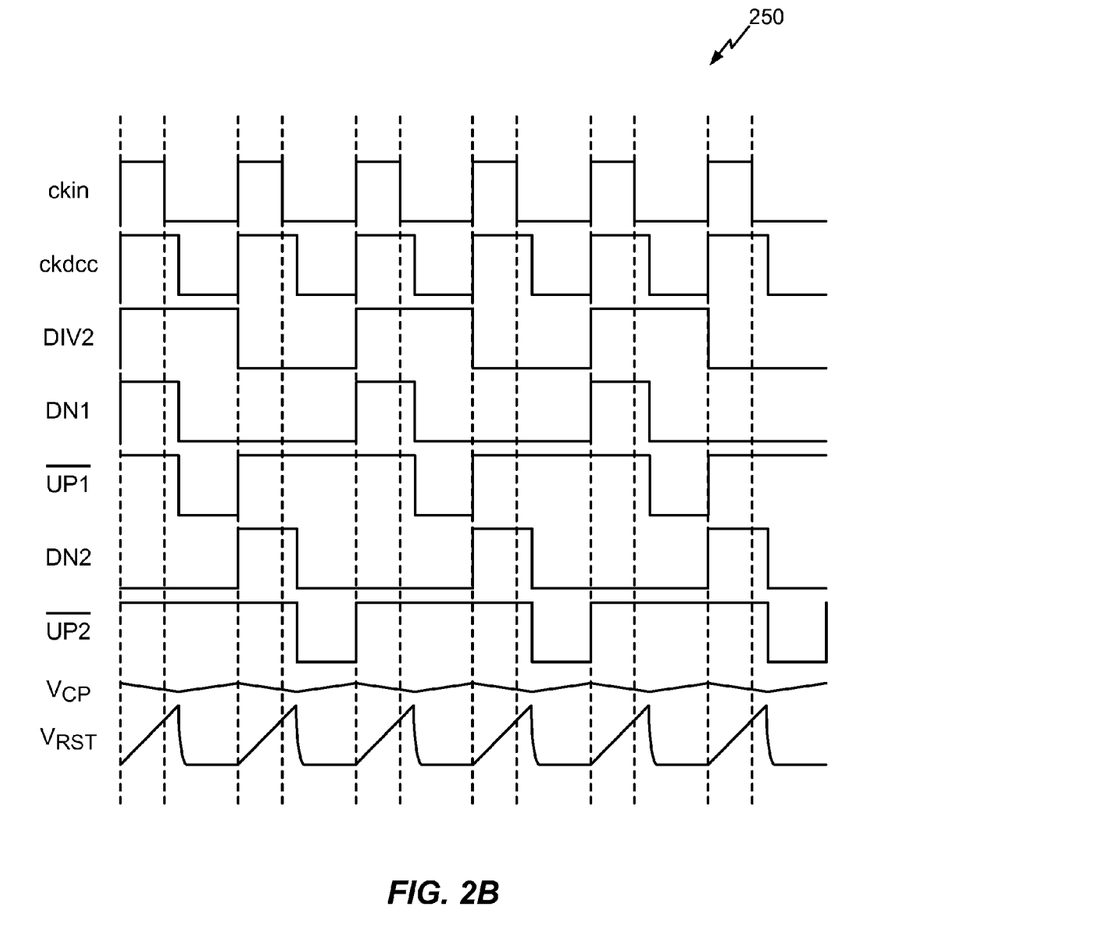
FIG. 2B is a timing diagram associated with the duty cycle corrector of FIG. 2A.

FIG. 2B is an example timing diagram 250 for operating device 200 of FIG. 2A. Time diagram 250 includes timing signals for a clock input signal ckin, clock signal ckdcc, signal DIV2, signals DN1 and DN2, signals $\overline{UP1}$ and $\overline{UP2}$, charge pump voltage $V_{CP}$, and reset voltage $V_{RST}$. As depicted in timing diagram 250, device 200, via duty cycle correction, is configured to position the rising and falling edges of clock signal ckdcc at substantially 0° and 180° degree phases, respectively.

Figure 3A:
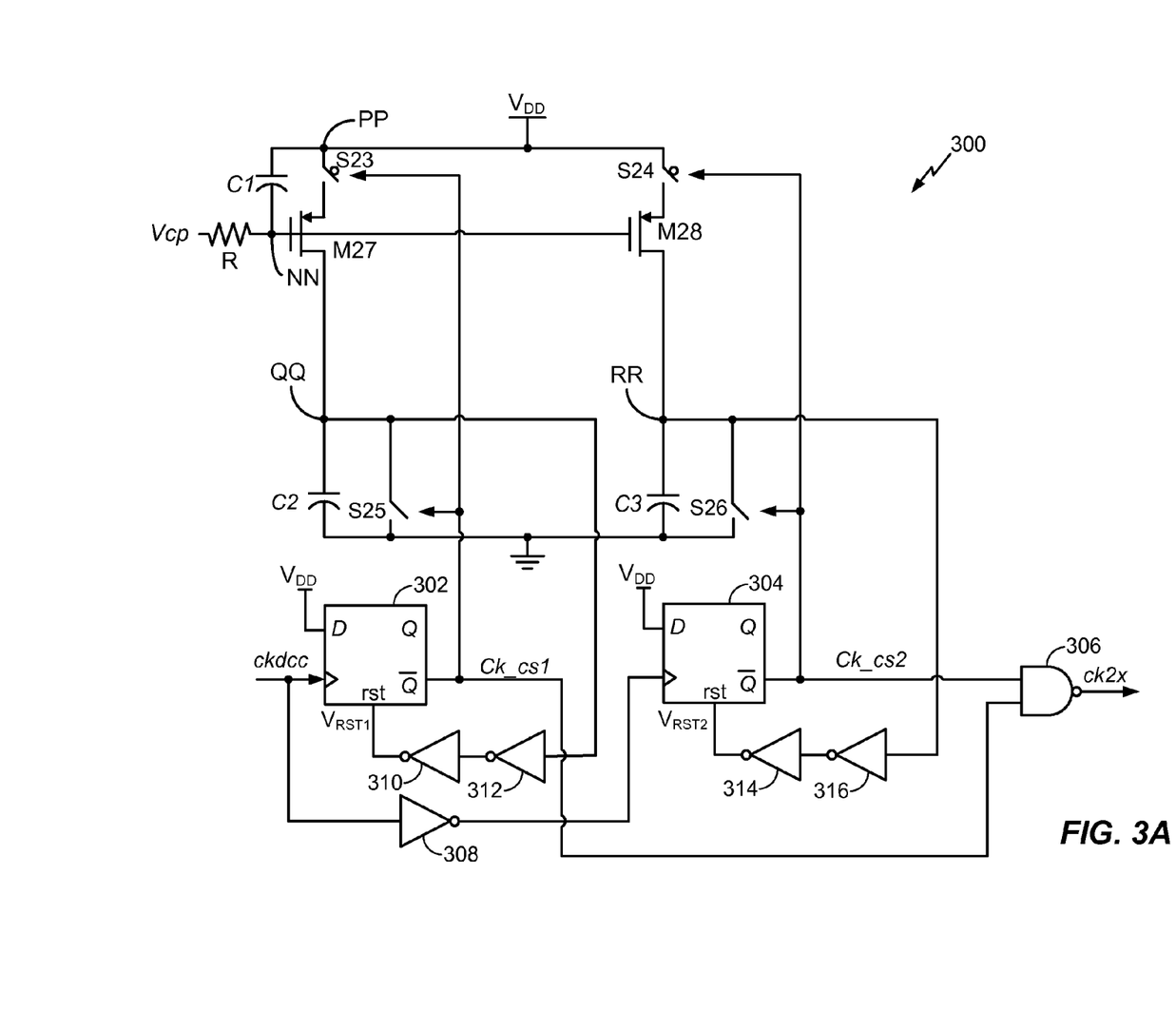
FIG. 3A illustrates a clock generator, in accordance with an exemplary embodiment of the present invention.

Further, according to an exemplary embodiment, quarter period pulses at the rising and falling edges of a duty cycle corrected clock (e.g., clock signal ckdcc) may be generated via a clock generator. FIG. 3A illustrates a clock generator 300, in accordance with an exemplary embodiment. Clock generator 300 includes transistors M27 and M28, capacitors C1, C2 and C3, resistor R, switches S23-S26, flip-flops 302 and 304, NAND gate 306, and inverters 308, 310, 312, 314, and 316.

A gate of transistor M27 is coupled to a gate of transistor M28 and a node NN, which is further coupled to an input via resistor R. Capacitor C1 is coupled between node NN and a node PP, which is coupled to supply voltage $V_{DD}$ and may be coupled to a source of transistor M27 via switch S23. A drain of transistor M27 is coupled to a node QQ that is coupled to one side of capacitor C2. Another side of capacitor C2 is coupled to a ground voltage GRND. Node QQ, which may be coupled to ground voltage GRND via switch S25, is also coupled to an input of inverter 312. An output of inverter 312 is coupled to an input of inverter 310, which has an output coupled to a reset port rst of flip-flop 302.

A source of transistor M28 may be coupled to supply voltage $V_{DD}$ via switch S24. Moreover, a drain of transistor M28 is coupled to a node RR that is coupled to one side of capacitor C3. Another side of capacitor C3 is coupled to ground voltage GRND. Further, node RR, which may be coupled to ground voltage GRND via switch S26, is also coupled to an input of inverter 316. An output of inverter 316 is coupled to an input of inverter 314, which has an output coupled to a reset port rst of flip-flop 304. According to one example, capacitors C2 and C3 may each comprise capacitance values that are one-half the capacitance value of capacitor $C_{INT}$ (see FIG. 2) (i.e., for example, C2=C3=½ $C_{INT}$).

Each of flip-flop 302 and 304 is configured to receive supply voltage $V_{DD}$ and clock signal ckdcc. In addition, flip-flop 302 is configured to convey a signal ck_cs1 to a port of NAND gate 306. Signal ck_cs1 may also be received by switches S23 and S25 for controlling operation thereof. Flip-flop 304 is configured to convey a signal ck_cs2 to another port of NAND gate 306. Signal ck_cs2 may also be received by switches S24 and S26 for controlling operation thereof. NAND gate 306 is configured to output a clock signal ck2x having a duty cycle of substantially 50% and a frequency, which is doubled relative to the frequency of clock signal ckdcc.

Accordingly, clock generator 300 includes two current source and capacitor stages (i.e., a stage including transistor M27 and capacitor C2 and a stage including transistor M28 and capacitor C3), similar to a final stage of device 200 (i.e., a stage including transistor M17 and capacitor $C_{INT}$). However, as noted above, capacitors C2 and C3 may comprise a capacitance that is one-half of a capacitance of capacitor $C_{INT}$ and, therefore, capacitors C2 and C3 will integrate to an inverter threshold in one quarter of an input clock cycle. One stage of clock generator 300 operates on an even phase of the corrected clock and one stage operates on an opposite phase of the corrected clock. An output of each of flip-flop 302 and 304 is a clock at the same frequency as clock signal ckdcc, but with 25% duty cycle. The inverse of clock signals ck_cs1 and the inverse of clock signal ck_cs2 may be combined via NAND gate 306 to produce clock signal ck2x. It is noted that an RC filter (i.e., resistor R and capacitor C1) may remove the triangularity of voltage $V_{CP}$ to prevent the ripple on voltage $V_{CP}$ from overly affecting the duty cycle of the doubled clock.

Figure 3B:
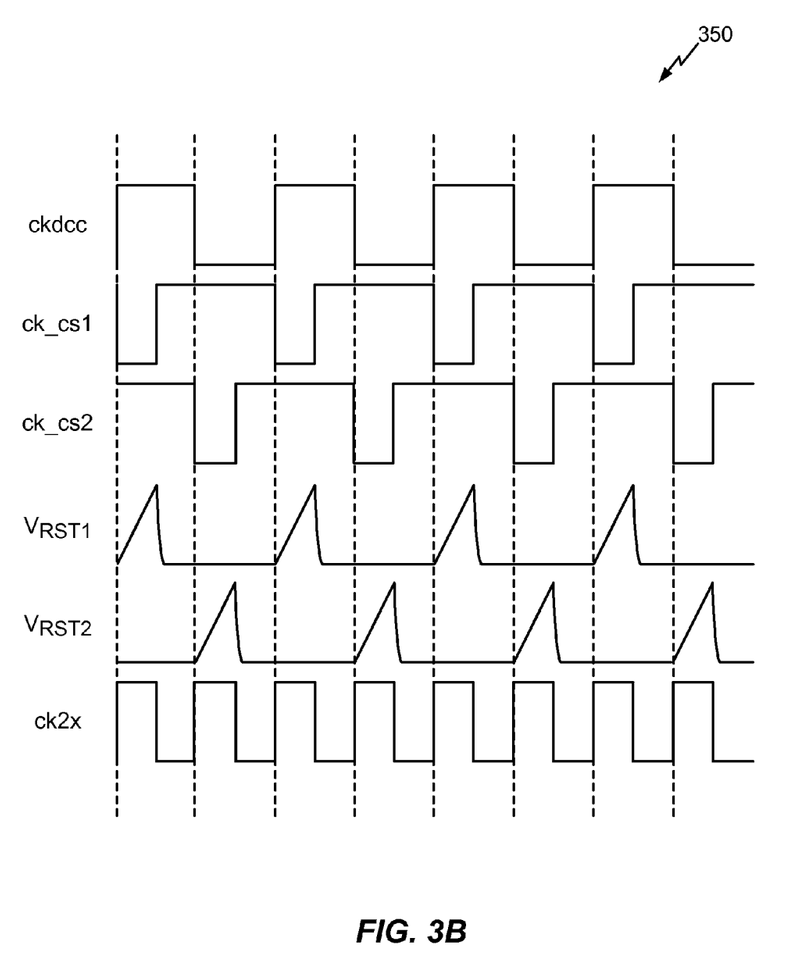
FIG. 3B is a timing diagram associated with the clock generator of FIG. 3A.

FIG. 3B is an example timing diagram 350 for operating device 300 of FIG. 3A. Time diagram 350 includes timing signals for clock signal ckdcc, signal ck_cs1, signal ck_cs2, reset voltage $V_{RST1}$, reset voltage $V_{RST2}$, and clock signal ck2x.

Figure 4:
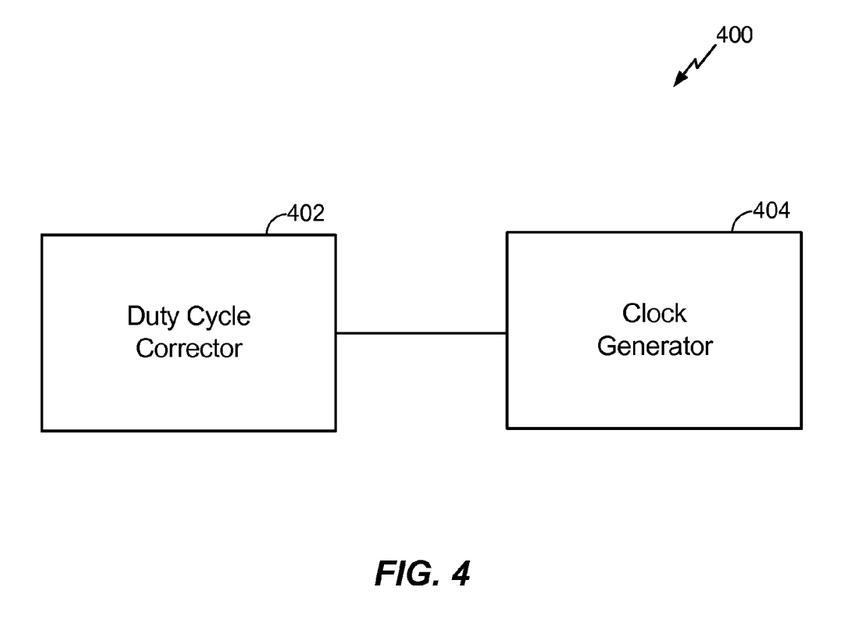
FIG. 4 is a block diagram of a clock doubler including a duty cycle corrector and a clock generator, according to an exemplary embodiment of the present invention.

FIG. 4 depicts a device 400, according to an exemplary embodiment of the present invention. Device 400, which may comprise a clock doubler with mismatch cancellation, includes a duty cycle corrector 402 coupled to a clock generator 404. By way of example only, duty cycle corrector 402 may comprise device 200 (e.g., a duty cycle corrector) illustrated in FIG. 2, and clock generator 404 may comprise clock generator 300 illustrated in FIG. 3. Device 402 may be configured to receive a clock signal and output a corrected clock signal. Further, clock generator 404 may be configured to receive the corrected clock signal and output a clock signal having a frequency that is doubled with respect to a frequency of the corrected clock signal.

Figure 5:
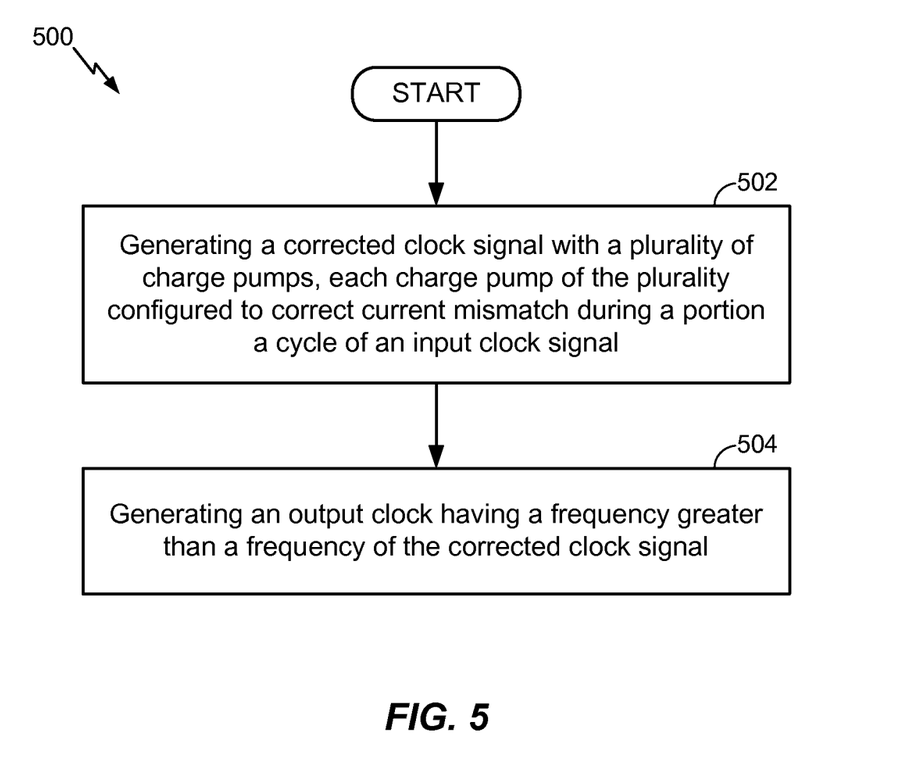
FIG. 5 is a flowchart depicting a method, in accordance with an exemplary embodiment of the present invention.

FIG. 5 is a flowchart illustrating a method 500, in accordance with one or more exemplary embodiments. Method 500 may include generating a corrected clock signal with a plurality of charge pumps, each charge pump of the plurality configured to correct current mismatch during a portion a cycle of an input clock signal (depicted by numeral 502). In addition, method 500 may also include generating an output clock having a frequency greater than a frequency of the corrected clock signal (depicted by numeral 504).

Figure 6:
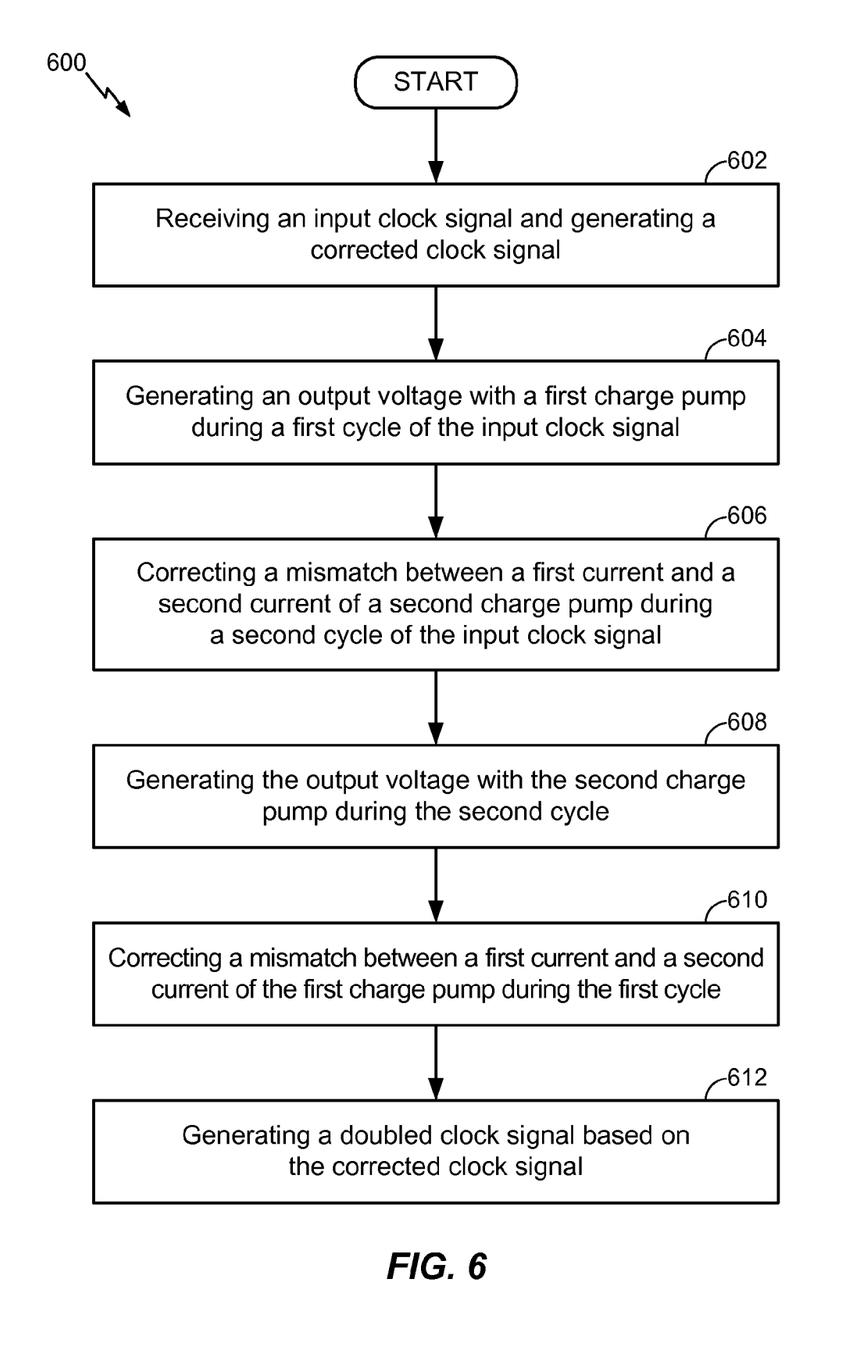
FIG. 6 is a flowchart depicting another method, in accordance with an exemplary embodiment of the present invention.

FIG. 6 is a flowchart illustrating another method 600, in accordance with one or more exemplary embodiments. Method 600 may include receiving an input clock signal and generating a corrected clock signal (depicted by numeral 602). In addition, method 600 may also include generating an output voltage with a first charge pump during a first cycle of the input clock signal (depicted by numeral 604). Method 600 may also include correcting a mismatch between a first current and a second current of a second charge pump during a second cycle of the input clock signal (depicted by numeral 606). Method 600 may further include generating the output voltage with the second charge pump during the second cycle (depicted by numeral 608). In addition, method 600 may include correcting a mismatch between a first current and a second current of the first charge pump during the first cycle (depicted by numeral 610). Moreover, method 600 may include generating a doubled clock signal based on the corrected clock signal (depicted by numeral 612).

Figure 7:
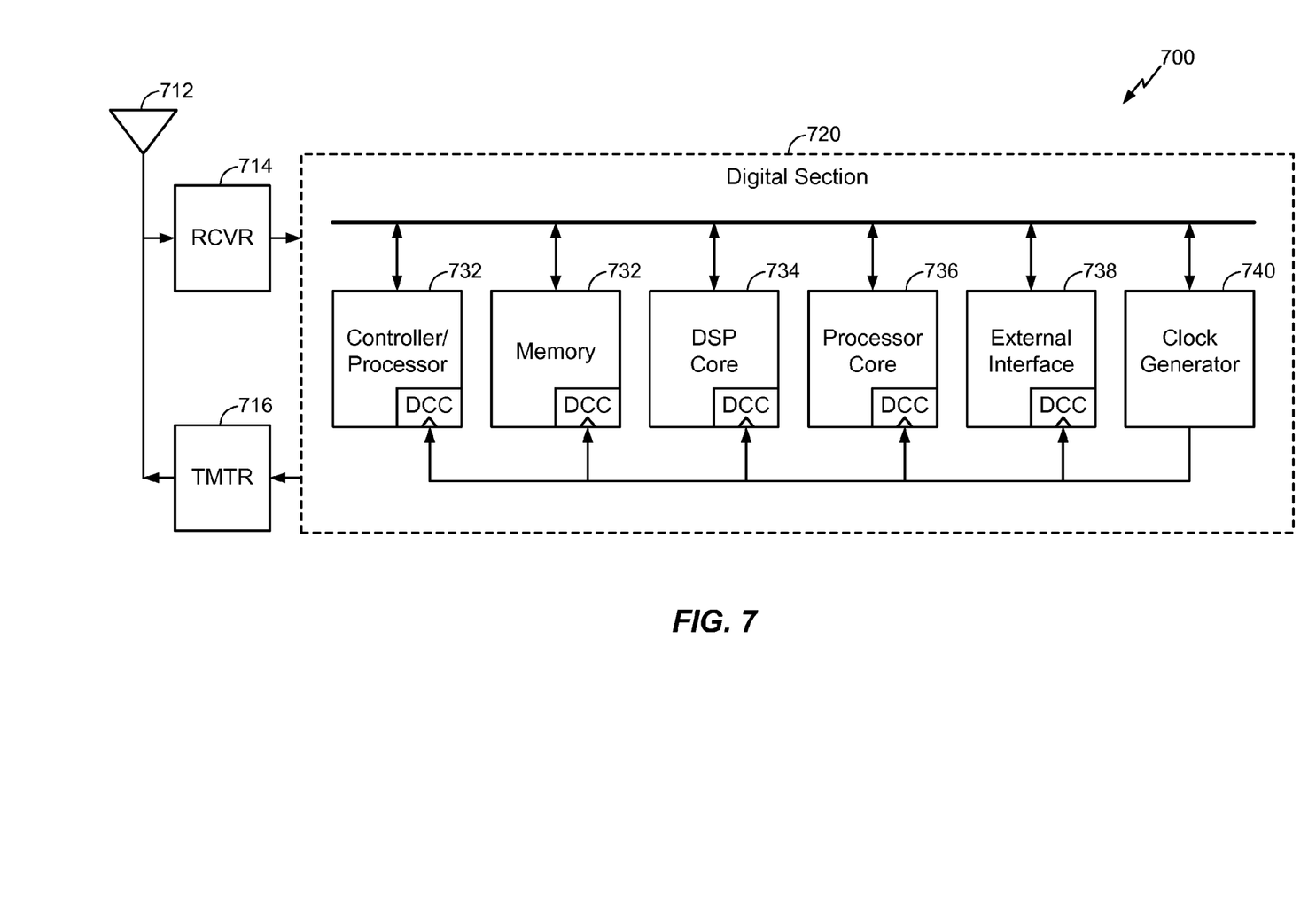
FIG. 7 illustrates a device including a duty cycle corrector and a clock generator, in accordance with an exemplary embodiment of the present invention

FIG. 7 shows a block diagram of a wireless device 700, which may be may be a cellular phone, a terminal, a personal digital assistant (PDA), a handset, or some other device. Wireless device 700 may be able to communicate with various wireless communication systems such as CDMA, TDMA, FDMA, GSM, OFDMA, GPS and/or other systems known in the art.

On the receive path, an antenna 712 receives signals transmitted by base stations and/or satellites and provides a received signal to a receiver (RCVR) 714. Receiver 714 processes (e.g., filters, amplifies, frequency downconverts, and digitizes) the received signal and provides samples to a digital module 720 for further processing. On the transmit path, digital module 720 processes data to be transmitted and provides data chips to a transmitter (TMTR) 716. Transmitter 716 processes (e.g., converts to analog, filters, amplifies, and frequency upconverts) the data chips and generates a modulated signal, which is transmitted via antenna 712.

Digital module 720 includes various processing units that support communication and/or other functions. Within digital module 720, a digital signal processor (DSP) core 734 performs processing (e.g., encoding and modulation) for the transmit path, processing (e.g., demodulation and decoding) for the receive path, and/or processing for other applications and functions. A processor core 736 supports various functions such as video, audio, graphics, gaming, and so on. A controller/processor 730 directs the operation of the processing units within digital module 720. A memory 732 stores data and program codes for the processing units. An external interface unit 738 interfaces with other units external to digital module 720.

A clock generator 740, which may comprise device 400 (see FIG. 4), generates clock signals used by the processing units within digital module 720. Clock generator 740, which may comprise a clock doubler, may include one or more VCOs and/or PLLs to generate the clock signals. Clock generator 740 distributes clock signals to other processing units within digital module 720. The clock distribution network is represented by the lines going from clock generator 740 to other processing units. Clock generator 740 may be implemented in controller/processor 730, memory 732, DSP core 734, processor core 736, interface unit 738, and/or other units.

The clock generator described herein may be used to improve the duty cycle of a clock signal from an oscillator, a PLL, a clock distribution network, or some other clock source. The clock generator can generate an output clock signal having a good duty cycle, e.g., close to 50%. Duty cycle may be an important specification of the clock signal and may be more important for higher clock rates used in many modern day electronics devices. The clock generator can be conveniently implemented in any part of an integrated circuit and used to correct a clock duty cycle wherever needed. Any number of clock generators circuits may be implemented on a given integrated circuit.

The clock generator described herein may be implemented in an integrated circuit (IC), an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, and other electronic units. The clock generator may also be fabricated using various IC process technologies such as CMOS, N-MOS, P-MOS, BJT, GaAs, and so on. The clock generator may also be implemented with discrete components.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
   a duty cycle correction circuit configured to receive an input clock signal and convey a corrected clock signal, the duty cycle correction circuit including:
      a first circuit to convey an output voltage during a first cycle of the input clock signal and correct a current mismatch of the first circuit during a second cycle of the input clock signal, the first circuit including a differential pair of transistors for comparing a reference voltage to a voltage across a capacitor configured to receive a first and second current during the second cycle; and
      a second circuit to convey the output voltage during the second cycle and correct a current mismatch of the second circuit during the first cycle; and
   a clock generator for receiving the corrected clock signal and generating an output clock.

2. The device of claim 1, further comprising an output capacitor configured to receive the output voltage during each of the first and second cycles.

3. The device of claim 1, the output clock having a duty cycle of substantially 50% and a frequency that is increased relative to a frequency of the corrected clock signal.

4. The device of claim 1, further comprising a feedback loop for correcting a current mismatch if the voltage across the capacitor is different than the reference voltage.

5. A device, comprising:
   a first charge pump configured for generating an output voltage during a phase of an input clock signal, the first charge comprises a capacitor configured for receiving an up current and a down current of the first charge pump during another, different phase of the input clock signal;
   a second charge pump for generating the output voltage during the another, different phase of the input clock signal, each of the first and second charge pumps configured for generating a corrected clock signal based on the input clock signal; and
   a clock generator coupled to each of the first and second charge pumps and configured for receiving the corrected clock signal and generating an output clock signal having a frequency that is doubled relative to a frequency of the corrected clock signal.

6. The device of claim 5, the first charge pump further configured for detecting and correcting a mismatch between a first current and a second current of the first charge pump during the another, different phase of the input clock signal.

7. The device of claim 5, the second charge pump further configured for detecting and correcting a mismatch between a first current and a second current of the second charge pump during the phase of the input clock signal.

8. The device of claim 5, the output clock signal having a duty cycle of substantially 50%.

9. The device of claim 5, the first charge pump further comprising a differential pair of transistors configured to measure a difference between a voltage across the capacitor and a reference voltage.

10. The device of claim 9, further comprising a feedback loop for correcting a current mismatch if the voltage across the capacitor is different than the reference voltage.

11. The device of claim 5, the second charge pump further comprising a capacitor configured for receiving an up current and a down current of the second charge pump during the phase of the input clock signal.

12. The device of claim 11, the second charge pump further comprising a differential pair of transistors configured to measure a difference between a voltage across the capacitor and a reference voltage.

13. The device of claim 12, further comprising a feedback loop for correcting a current mismatch if the voltage across the capacitor is different than the reference voltage.

14. A method, comprising:
generating a corrected clock signal with a plurality of charge pumps, including a first charge pump and a second charge pump;
detecting a mismatch between a first current and a second current of the first charge pump;
detecting a mismatch between a first current and a second current of a second charge pump, wherein
each charge pump of the plurality configured to correct current mismatch during a portion a cycle of an input clock signal; and
generating an output clock having a frequency greater than a frequency of the corrected clock signal,
wherein detecting the mismatch in either the first charge pump or the second charge pump comprises comparing a reference voltage to a voltage stored across a capacitor.

15. The method of claim 14, wherein generating a corrected clock signal comprises:
generating an output voltage with the first charge pump of the plurality during a first cycle of the input clock signal;
correcting a mismatch between the first current and the second current of the second charge pump of the plurality during a second cycle of the input clock signal;
generating the output voltage with the second charge pump during the second cycle; and
correcting a mismatch between a first current and a second current of the first charge pump during the first cycle.

16. A method, comprising:
receiving an input clock signal and generating a corrected clock signal;
generating an output voltage with a first charge pump during a first cycle of the input clock signal;
correcting a mismatch between a first current and a second current of a second charge pump during a second cycle of the input clock signal;
generating the output voltage with the second charge pump during the second cycle;
correcting a mismatch between a first current and a second current of the first charge pump during the first cycle; and
generating a doubled clock signal based on the corrected clock signal,
wherein correcting the mismatch in either the first charge pump or the second charge pump comprises comparing a reference voltage to a voltage stored across a capacitor.

17. The method of claim 16, wherein generating a doubled clock signal comprises generating the doubled clock signal having a duty cycle of substantially 50% based on the corrected clock signal having a duty cycle of substantially 50% and a frequency less than a frequency of the doubled clock signal.

18. A device, comprising:
a duty cycle correction circuit configured to receive an input clock signal and convey a corrected clock signal, the duty cycle correction circuit including:
a first circuit to convey an output voltage during a first cycle of the input clock signal and correct a current mismatch of the first circuit during a second cycle of the input clock signal; and
a second circuit to convey the output voltage during the second cycle and correct a current mismatch of the second circuit during the first cycle, the second circuit including a differential pair of transistors for comparing a reference voltage to a voltage across a capacitor configured to receive a first and second current during the first cycle; and
a clock generator for receiving the corrected clock signal and generating an output clock.

19. The device of claim 18, further comprising a feedback loop for correcting a current mismatch if the voltage across the capacitor is different than the reference voltage.

* * * * *